(12) United States Patent
Rohrböck et al.

(10) Patent No.: US 6,344,730 B1
(45) Date of Patent: Feb. 5, 2002

(54) METHOD AND APPARATUS FOR DETERMINING THE REMAINING OPERATING TIME OF BATTERY-POWERED APPLIANCES

(75) Inventors: Rupert Rohrböck, Martinsdorf; Josef Wurzer, Vienna, both of (AT)

(73) Assignee: AKG Acoustics GmbH, Vienna (AT)

( * ) Notice: Subject to any disclaimer, the term of this patent is extended or adjusted under 35 U.S.C. 154(b) by 0 days.

(21) Appl. No.: 09/543,454

(22) Filed: Apr. 5, 2000

(30) Foreign Application Priority Data

Apr. 9, 1999 (AT) .............................. A 631/99

(51) Int. Cl.⁷ ..................... H02J 7/00; G01N 27/416; G06F 19/00
(52) U.S. Cl. ................. 320/132; 320/134; 320/136; 324/433; 702/63
(58) Field of Search ................. 320/132, 134, 320/136, 157; 324/427, 433; 702/63

(56) References Cited

U.S. PATENT DOCUMENTS 5,297,119 A * 3/1994 Tonegawa et al. ............ 368/41
5,572,110 A * 11/1996 Dunstan ...................... 320/106
5,631,538 A * 5/1997 Komrska ..................... 320/155
5,739,596 A * 4/1998 Takizawa et al. ............. 307/66
6,108,579 A * 8/2000 Snell et al. .................... 607/29

OTHER PUBLICATIONS

The IEEE Standard Dictionary of Electrical and Electronics Terms, 6th ed., 1996, p. 82.*

David Linden, Handbook Of Batteries, 1994, pp. A.1 and A.9.*

* cited by examiner

Primary Examiner—Gregory J. Toatley, Jr
(74) Attorney, Agent, or Firm—Friedrich Kueffner

(57) ABSTRACT

A method and apparatus for determining the remaining operating time of an appliance powered by batteries or accumulators determine and indicate the remaining operating time by measuring and evaluating the battery voltage wherein an EEPROM is provided which stores the value of the battery voltage at the instant of switching off the appliance.

8 Claims, 1 Drawing Sheet

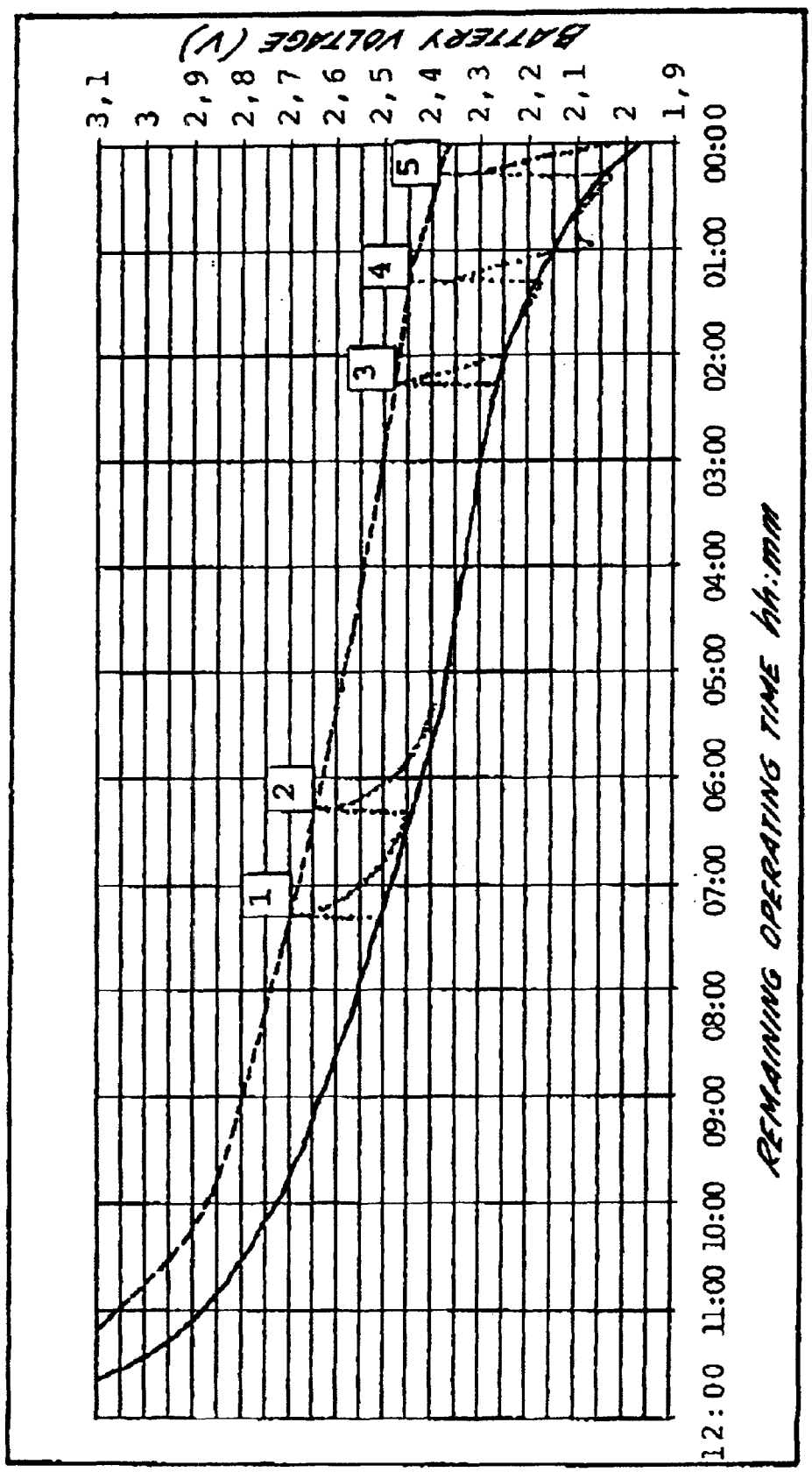

METHOD AND APPARATUS FOR DETERMINING THE REMAINING OPERATING TIME OF BATTERY-POWERED APPLIANCES

BACKGROUND OF THE INVENTION

1. Field of the Invention

The invention relates to a method and apparatus for determining the remaining operating time of an appliance powered by batteries or accumulators.

2. Description of the Related Art

Generally this remaining operating time is determined in that the charge condition is determined from the battery discharge curve by ascertaining the voltage state and, based on the voltage state, the remaining operating time is determined and ultimately displayed.

However, this method according to the state of the art has various defects and problems:

After switching off the appliance and storing it in the switched-off condition, the battery voltage recovers in such a way that, when the appliance is switched on again, an excessively long remaining operating time is indicated. The error associated therewith can amount to a multiple of the remaining operating time actually available, particularly towards the end of battery charging and after relatively long storage in the unused condition so that the resting voltage curve is obtained.

Another source of error is the fact that known display devices have set predetermined battery discharge curves and apply this discharge curve even if accumulators (secondary cells) and not batteries (primary cells) are used, whereby an intrinsic error occurs which indicates a clearly false remaining operating time.

The main reason for this is that the remaining operating time forecast in the case of accumulators encounters various problems which arise from the characteristics of the accumulators themselves (past history within the charge cycles, characteristics of the preceding charge cycles, holding or not holding deep discharges, memory effect or disturbances caused by temporary short-circuiting of the accumulator, etc.). Therefore, as indicated above, battery charge curves are generally presupposed and the errors in the case of accumulators are accepted.

Determining apparatus of this type are used in various appliances, in particular battery-powered microphones, headphones, tape recorders, mobile telephones and the like.

SUMMARY OF THE INVENTION

The invention aims to devise an apparatus in which the aforementioned problems are at least substantially diminished or entirely obviated.

According to the invention, this is achieved in that an EEPROM is provided, which stores the value of the battery voltage at the instant of switching off the appliance. This measure makes it possible to obviate the error which arises as result of the voltage recovery of the battery during the off-time so that, particularly when the appliance is switched on, the major error, depending on its value, occurring in the state of the art is obviated. Since it is also often decided when switching on the appliance whether new batteries are to be installed or at least held in readiness, with the display according to the invention this decision can be made with a substantially higher degree of reliability.

In one development the apparatus is provided with a battery change detector which detects changing of the batteries. For example, this may be a contact which monitors the opening of the battery compartment, or a control circuit which detects whether the contact between the appliance and the battery has been interrupted, similar to the theft protection in automobile radios.

This measure makes it is possible, in such a case, for example to assume that the newly installed batteries have been stored for a relatively long time without load, for which reason the voltage value obtained upon switching on is taken as a no-load value and the indicated remaining operating time is corrected accordingly.

Finally, in a preferred development it is provided that when switching on the appliance or when the battery charge detector has recognised the replacement, a load test is performed for the installed batteries so that it is possible to distinguish whether batteries or accumulators have been installed.

BRIEF DESCRIPTION OF THE DRAWING

The invention will be illustrated in more detail below with reference to the accompanying drawing. The single FIGURE or the drawing shows schematically a graph of the battery voltage plotted against the remaining operating time available.

DESCRIPTION OF PREFERRED EMBODIMENTS

In the graph illustrated the solid line indicates the voltage curve of the battery against the remaining operating time under normal load. The no-load voltage curve is indicated in dashed line, likewise against the remaining operating time.

If, for example, the appliance is now switched off, indicating at Point 1 slightly more than 7 hours remaining operating time, and is kept for a relatively long time in the switched-off condition, the battery recovers and after being switched on again shows the voltage which corresponds to the no-load curve at Point 1, approximately 2.7 Volts, so that the appliance erroneously indicates a remaining operating time of almost 10 hours. The actual discharge curve after being switched on again is the steeply descending curve which merges approximately tangentially into the normal load discharge curve and then follows it.

Also at Point 2 the error indication at the beginning of recommencement of operation is tenable since the actual remaining operating time of slightly more than 6 hours is still considerable. The situation is different upon switching off the appliance towards the end of the cycle time of the battery, as is evident from Points 3,4 and 5.

At Point 3, for example, a genuine remaining operating time of just over 2 hours is contrasted with a remaining operating time of slightly more than 7 hours erroneously indicated when the appliance is switched on again.

Finally, at Point 5 instead of approximately 20 minutes more than 5 hours are indicated, which is wholly out of the question.

According to the invention, the determination of the remaining operating time is effected in that after the switching-off of the appliance the instantaneous voltage value of the battery at the switching-off time is stored in the EEPROM. If the battery is not changed, the next time the appliance is switched on an accurate indication of the remaining operating time can be provided as a result of the use and evaluation of the voltage value stored at the switching-off time. This value is frozen for approximately 30 minutes, since the actual battery voltage applied during this time does not make possible a reliable indication of remaining operating time. During this time interval the voltage decreases from the no-load curve to the normal load discharge curve, so that with subsequent indication of the remaining operating time it is possible to start from the correct value and upon switching off the appliance the correct value is again stored.

The recovery of the battery voltage is of course dependent on the recovery time so that a relatively long inoperative period increases the recovery of the actual battery voltage.

If during these 30 minutes the actual battery voltage falls below the voltage value stored in the EEPROM, the retention time is discontinued and it is assumed that the switching-off period between the last switching-off and renewed switching on was only so short that the battery voltage has not yet recovered to the no-load value and, therefore, has quickly reached the normal load voltage value and makes possible correct determination of the remaining operating time.

If a new battery is installed, in the preferred embodiment this is recognised by the battery change detector provided in this instance. It is assumed in this case that the battery has not been used for a relatively long time so that the no-load curve is used to calculate the remaining operating time. The remaining operating time is frozen until the appliance has been switched on for 30 minutes, whereupon the normal load discharge curve is used for accurate determination of the remaining operating time.

In one development, in which the apparatus according to the invention recognises whether batteries or accumulators are being used, each time the appliance is switched on or the first time it is switched on after the battery change detector has recognised a battery change, a load of 200 to 500, preferably 300 to 400 mA, is applied to the installed batteries/accumulators for approximately 0.15 seconds. As a result of the behaviour of the voltage under this load it can be detected whether batteries or accumulators have been installed. If the voltage difference (no-load voltage-load voltage) is below a threshold value, an accumulator has been installed, if it lies above the threshold value, batteries have been installed.

Despite all these remaining problems, the indication of the remaining operating time is substantially more reliable than hitherto and is increasingly reliable the more the following points are satisfied:

New batteries, charged in excess of 80%, are used.

If several batteries are used, like batteries are used, i.e. batteries of the same type and of like preload.

The batteries are only removed from the appliance when they are flat.

The newly installed batteries have previously undergone an at least two-hour rest interval in the non-loaded condition.

In particular, the following actions lead to false indications:

When changing batteries one or more partly discharged batteries are installed which had been under load until shortly before installation: In this case a shorter remaining operating time is indicated than is actually present.

Batteries with different residual capacitances are used: Initially, an obviously overlong remaining operating time is indicated, then the indication rapidly falls to lower values which are dependent on the residual capacitance of the weaker battery.

Use at temperatures below +10° C.

The appliance was operation only briefly so that it is not in operation for 30 consecutive minutes. Therefore, during evaluation no change from the no-load curve to the normal load curve takes place: If the batteries are only about half charged, the indication will be false with brief intervals between operation.

It has to be pointed out as being a special feature of accumulator operation that different accumulators have different discharge curves which are replaced by a mean curve so that the indication with accumulator use is generally not as accurate was with battery use.

In a typical remaining operating time display this is effected by three LEDs, for example a green light for a remaining operating time of more than 6 hours, an orange light for a remaining operating time of 3 to 6 hours, a red light for 1 to 3 hours and the red LED in flashing mode for a remaining operating time of less than one hour, associated with the recommendation to change the batteries. When using batteries it is possible with the above-described device for the respective transition from one indication to the next to be obtained with a degree of accuracy of approximately one half hour.

The invention is not restricted to the example of embodiment described but can be modified in various ways. For example, the display can be provided other than by LEDs, the device for detecting the battery change can be designed differently to that described and, of course, the different charge curves can be stored in a wide variety of ways.

The evaluating electronics can be readily devised by the person skilled in the art in the knowledge of the invention and depending on the respective type of appliance and display and there is no need for further explanation here.

What is claimed is:

1. An apparatus for determining the remaining operating time of an appliance that is switched on and off and powered by batteries or accumulators, which apparatus determines and indicates the remaining operating time by measuring and evaluating with an evaluating electronics the battery voltage, wherein the apparatus has an EEPROM which stores the value of the battery voltage at the instant of switching off the appliance, wherein the apparatus is configured to send the value of the battery voltage stored in the EEPROM to the evaluating electronics when the apparatus is switched on and the value of the battery voltage is used as a basis for evaluating and displaying by the evaluating electronics.

2. An apparatus according to claim 1, wherein the apparatus is provided with a battery change detector, for example a contact, which monitors the opening of the battery compartment, or a control circuit which detects whether the contact between the appliance and the battery has been interrupted.

3. A method of determining the remaining operating time of an appliance powered by batteries or accumulators, which by measuring and evaluating the battery voltage determines and displays the remaining operating time, wherein the value of the battery voltage at the instant of switching off the appliance apparatus is stored in the EEPROM and when it is switched on the value stored in the EEPROM is used as a basis for the evaluation and display.

4. A method according to claim 3, wherein after switching on the appliance the value stored in the EEPROM is used for a holding time of preferably about 30 minutes and then the actual value of the battery voltage is used.

5. A method according to claim 4, wherein if the actual value of the battery voltage falls below the value stored in the EEPROM before the holding time has elapsed, the actual value is used as a basis for the evaluation and display.

6. A method according to claim 3, wherein, after switching on the appliance or after recognizing a battery change by a battery change detector, a load test is performed for the installed batteries so as to determine whether batteries or accumulators have been installed.

7. A method according to claim 6, wherein a load of 200 to 500, preferably 300 to 400 mA, is applied to the installed batteries/accumulators for approximately 0.15 seconds, and the resultant voltage difference is determined and evaluated.

8. A method according to claim 3 wherein when a battery change has been detected and, optionally, when it is detected that batteries and not accumulators have been installed, the measured voltage is used to determine the remaining operating time, taking into account the assumption that the batteries installed had been stored for a relatively long time without load.

* * * * *